(12) United States Patent
Zhang et al.

(10) Patent No.: US 11,552,040 B2
(45) Date of Patent: Jan. 10, 2023

(54) PACKAGE PROCESS, DAF REPLACEMENT

(71) Applicant: Western Digital Technologies, Inc., San Jose, CA (US)

(72) Inventors: Siqi Zhang, Shanghai (CN); Xu Wang, Shanghai (CN); Pradeep Rai, San Jose, CA (US); Shrikar Bhagath, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 28 days.

(21) Appl. No.: 16/934,971

(22) Filed: Jul. 21, 2020

(65) Prior Publication Data

US 2022/0028819 A1 Jan. 27, 2022

(51) Int. Cl.
*H01L 23/00* (2006.01)

(52) U.S. Cl.
CPC .............. *H01L 24/27* (2013.01); *H01L 24/32* (2013.01); *H01L 2224/2747* (2013.01); *H01L 2224/27418* (2013.01); *H01L 2224/32145* (2013.01)

(58) Field of Classification Search
CPC .......... H01L 24/27; H01L 24/32; H01L 24/33
See application file for complete search history.

(56) References Cited

U.S. PATENT DOCUMENTS

| | | | | |
|---|---|---|---|---|
| 2006/0012020 A1* | 1/2006 | Gilleo | ..................... | H01L 24/97 257/678 |
| 2008/0152921 A1* | 6/2008 | Kropp | ........................ | C09J 9/02 428/414 |
| 2008/0160315 A1* | 7/2008 | Forray | ..................... | H01L 24/83 428/411.1 |
| 2012/0021608 A1* | 1/2012 | Arita | .................... | H01L 21/6836 438/703 |
| 2012/0299147 A1* | 11/2012 | Mitani | ................. | H01L 21/2007 257/506 |
| 2017/0053830 A1* | 2/2017 | Haimoto | ................ | H01L 21/304 |
| 2017/0271208 A1* | 9/2017 | Koshimizu | ........ | H01L 21/67092 |
| 2018/0226295 A1* | 8/2018 | Sugiya | ................. | H01L 21/6838 |
| 2019/0027408 A1* | 1/2019 | Sugiya | ..................... | H01L 21/78 |

FOREIGN PATENT DOCUMENTS

WO WO-2012149803 A1 * 11/2012 ............. H01L 24/97

OTHER PUBLICATIONS

Adamson, S. J., Klocke, J., DeSanctis, G., Dejene, A. "Die Bonding in a Mobile World," Chip Scale Review Mar./Apr. 2011; pp. 28-30.

* cited by examiner

*Primary Examiner* — Michele Fan

(74) *Attorney, Agent, or Firm* — Morgan, Lewis & Bockius LLP

(57) ABSTRACT

A method is disclosed herein. The method includes dicing a wafer and applying a mask. The method includes spraying die bond material, at a first temperature, to a surface of the wafer and cooling the die bond material at a second temperature to at least partially solidify the die bond material. The method also includes removing the mask from the wafer through the die bond material. After the removing of the mask, the method includes curing the die bond material to form a die attach film layer on the wafer.

11 Claims, 4 Drawing Sheets

US 11,552,040 B2

PACKAGE PROCESS, DAF REPLACEMENT

FIELD OF INVENTION

The invention relates to semiconductor device assembly, and more particularly, to thin die attach film (DAF) layers for semiconductor die stacks.

BACKGROUND

Generally, an integrated circuit (also referred to as a chip or a microchip) includes a small flat piece of semiconductor material with electronic circuits fabricated thereon. In integrated circuit fabrication, integrated circuits (i.e., chips) are produced in large batches on a wafer of electronic-grade silicon or other semiconductor. In device assembly or packaging, the wafer is cut (e.g., diced) into pieces called die, each containing at least one copy of the electronic circuits (e.g., copies of the chip). Oftentimes, the die are stacked and vertically connected to collectively behave as a single device that achieves performance improvements at reduced power and provides a smaller footprint than conventional two dimensional processes.

Conventionally, DAF is used between the dies to fix the dies to each other and into a static position. The stacked die/chips require precision placement on top of each other while not interfering with electrical connections (e.g., bond wires). Typically, DAF is applied as a tape or a liquid at ambient temperature to the wafer before the wafer is diced. After applying the DAF, ultraviolet radiation is applied to reduce a tack of the DAF, and each die is individually picked up and bonded either on a substrate or to another die at 90 degrees Celsius to 200 degrees Celsius (e.g., this range maybe referred to generally as "elevated temperatures"). Other manufacturing steps then are performed, such as electrical connection (e.g., wire bonding) and molding, so that the finished devices may be used in various electronic applications (e.g., mobile electronics).

Given space demands in these electronic applications, there is a need for decreasing sizes of the finished devices. In turn, it is desirable to decrease the size of the die stacks, which means reducing not only die thickness, but also DAF thickness, noting that present DAFs are 10 microns or greater in height.

SUMMARY

Various embodiments of semiconductor device assembly and in particular the DAF layer are disclosed. Broadly speaking, a method is provided that includes dicing a wafer and applying a mask. The method includes spraying die bond material, at a first temperature, to a surface of the wafer and cooling the die bond material at a second temperature to at least partially solidify the die bond material. The method also includes removing the mask from the wafer through the die bond material. After the removing of the mask, the method includes curing the die bond material to form a die attach film layer on the wafer.

According to one or more embodiments, the method can be implemented as a die stack, a device, an apparatus, and/or a system.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Disclosed herein are methods for manufacturing semiconductor die stacks, and more particularly, to thin DAF layers for semiconductor die stacks. More particularly, this disclosure relates to, according to one or more embodiments, a method where a diced wafer receives a mask that matches the pattern of the dicing. A die bond material, at a first temperature, is sprayed onto a surface of the wafer (with the mask still thereon) and, at a second temperature, to achieve partial solidification. The mask is then removed from the wafer through the die bond material. After the removing of the mask, the die bond material is cured to form a DAF layer on the wafer. The DAF layer is relatively thin compared to the conventional DAF discussed herein. That is, the technical effects and benefits of the method includes a DAF layer on the wafer achieving a thickness along a range of 2 μM to 5 μM (e.g., which is less than present DAFs that are 10 microns or greater in height).

Figure 1:
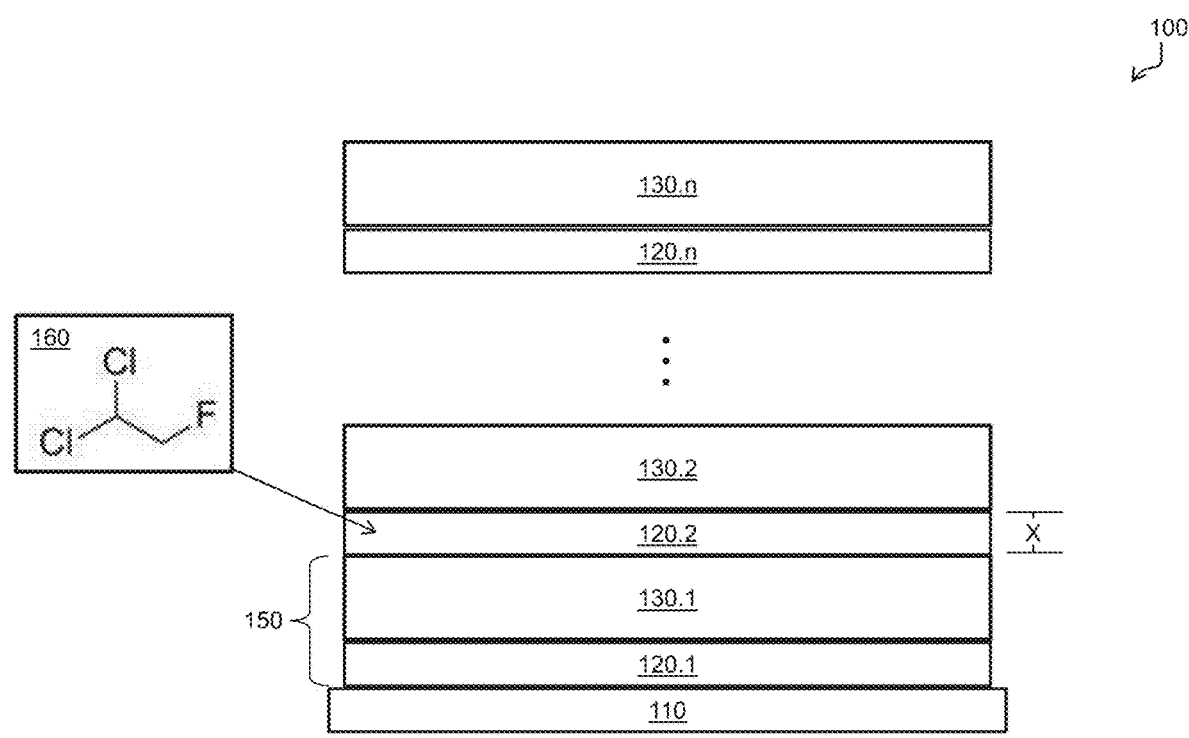
FIG. 1 is a schematic diagram of a semiconductor die stack including a DAF according to one or more embodiments.

FIG. 1 is a semiconductor die stack 100 according to one or more embodiment. The semiconductor die stack 100 including a substrate 110 and a plurality of DAF layers 120.1 to 120.*n* paired with a plurality of die 130.1 to 130.*n*, where 'n' is an integer greater than zero. The plurality of DAF layers 120.1 to 120.*n* and the plurality of die 130.1 to 130.*n* are, respectively and generally, referred to as DAF 120 and die 130 herein.

The DAF 120 includes as least a thickness X. The thickness X can be any thickness along a range of 2 μM to 5 μM, such as 3 μM. In accordance with one or more embodiments, the DAF 120 is the result of curing a die bond material. The die bond material may include 1,2 dichloro, 2-fluoroethane as depicted in block 160. In another aspect, the die bond material may include 1,2 dichloro, 2-fluoroethane and at least an additive. The additive may increase the viscosity of the die bond material.

The die 130 is a semiconductor die in which electrical circuits are fabricated. In an embodiment, for a die stack, the DAF 120 provides a die to die shear force that is greater than 0.5 MPa.

As shown in FIG. 1, the DAF 120 and the die 130 can be bonded to or on the substrate 110 as a pair 150. Note that each pair 150 of the semiconductor die stack 100 can result from a manufacturing process as described herein.

Figure 2:
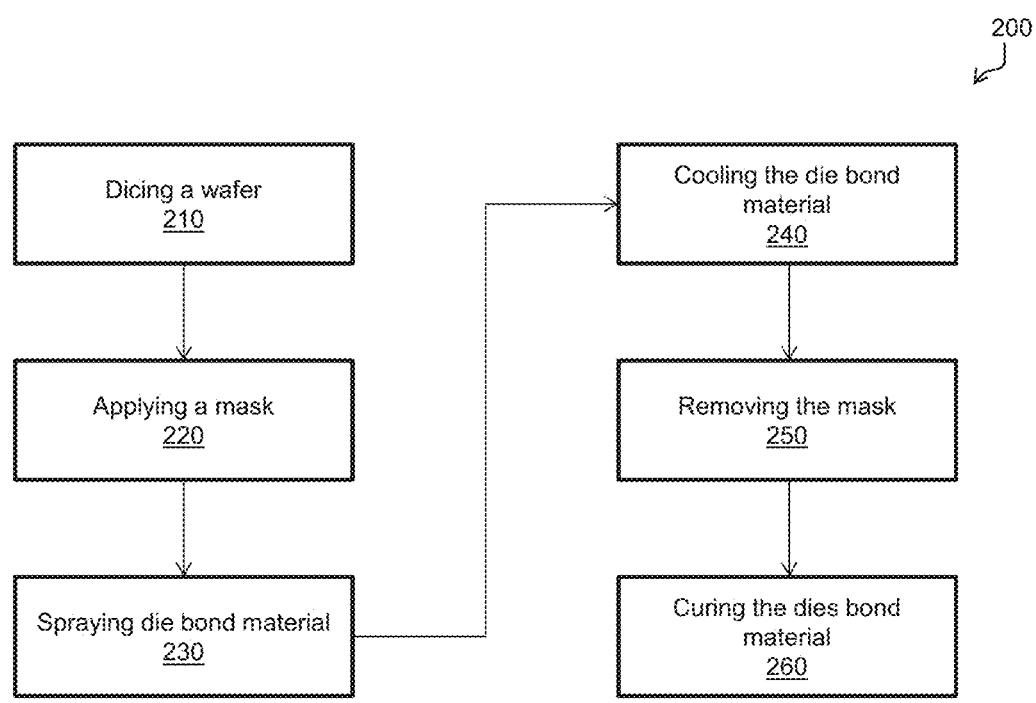
FIG. 2 is a flow diagram depicting a method for forming a DAF layer according to one or more embodiments.
Figure 3:
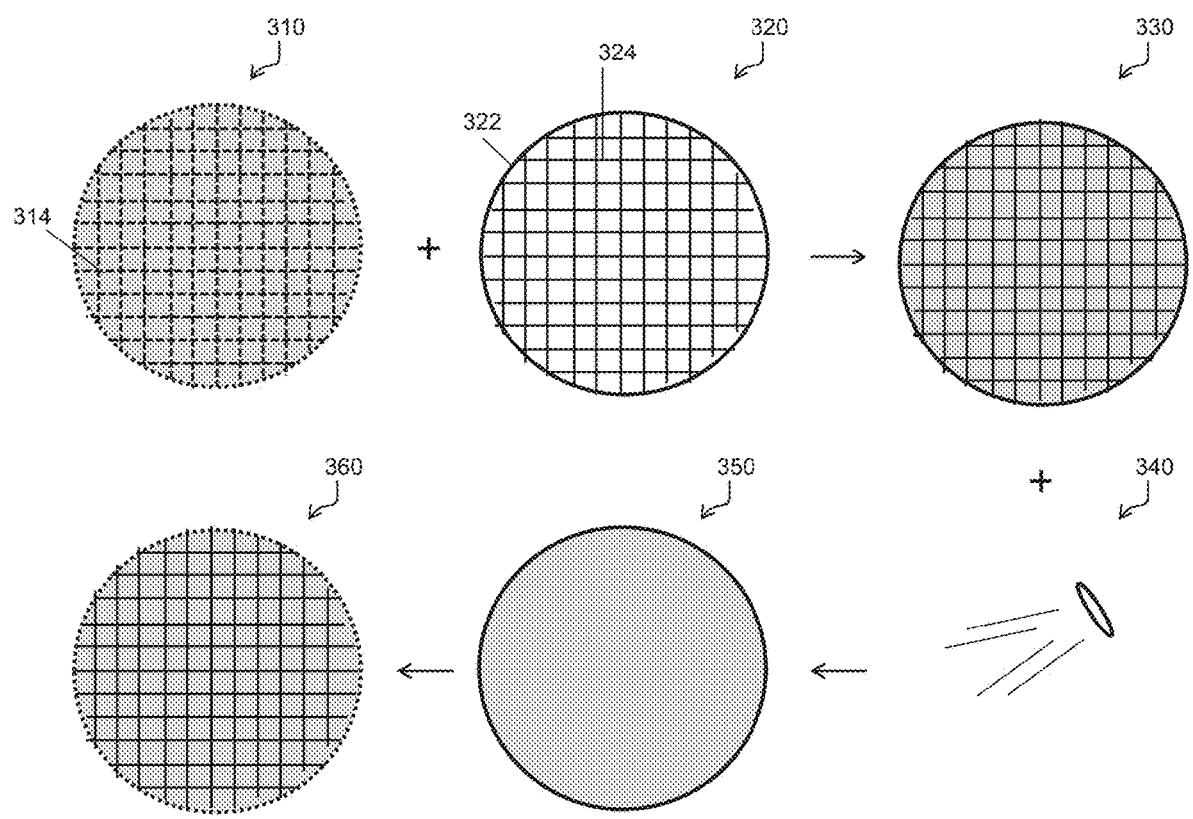
FIG. 3 is a schematic diagram depicting forming a DAF layer according to one or more embodiments.

Turning to FIGS. 2-3, a manufacturing process of each pair 150 of FIG. 1 is described. FIG. 2 is a flow diagram depicting a method 200 for forming a DAF layer according to one or more embodiments. FIG. 3 is a schematic depicting forming a DAF layer according to one or more embodiments. For ease of understating, FIGS. 2-3 are described contemporaneously.

At block 210, a wafer is diced using known techniques. The wafer can be a silicon wafer. In an embodiment, a ring or a frame can be used to stabilize the wafer during the dicing. In another embodiment, a ring or frame is not used to stabilize the wafer. The dicing may also be done using a saw having a saw width to allow for tolerance control. The schematic of FIG. 3 depicts a first or top view of a wafer 310, which has been previously diced according to a grid pattern 314.

At block 220, a mask is applied to the wafer. The mask can include a frame and a grid-like pattern (e.g., made of wires) that match that of the wafer. The schematic of FIG. 3 depicts a first or top view of a mask 320 having a frame 322 and a grid pattern 324 that matches the grid pattern 314 of the wafer 310. To apply the mask 320, the mask 320 is superimposed on top of the wafer 310, resulting in a combined surface (e.g., a combination mask and wafer 330). The combination mask and wafer 330 form a surface that may be generally flat. In an embodiment, the mask 320 is made of a metal material. The metal material is resistant to deformation at the first temperature.

At block 230, a die bond material is sprayed on to the wafer while the mask is applied. The die bond material can be sprayed according to one or more factors, such as a spray time, a spray pattern, or a spray angle. As shown in FIG. 3, the combination mask and wafer 330 receives a spray 340 thereupon. In this regard, the surface of the combination mask and wafer 330 can receive the spray 340 to produce a continuous layer 350 of a die bond material, which will result in a thin DAF layer.

In an embodiment, the die bond material is sprayed at a temperature. This temperature (e.g., a first temperature herein) may be any temperature at which the die bond material is in a liquid form. In an embodiment, the first temperature is selected from a range of approximately 150° C. to 220° C. In an embodiment, the first temperature is 220° C.

In an embodiment, a viscosity of the die bond material in liquid form allows for the spray to achieve a targeted thickness. In an embodiment, the viscosity of the die bond material in liquid form is in the range of W to Y. In an embodiment, at least one of an additive may be added to the liquid spray forming the die bond material. Such additives may increase the viscosity of the die bond material.

At block 240, the die bond material is cooled. In an embodiment, a temperature of the die bond material present on the silicon wafer (e.g., the first temperature at the time of spraying) is cooled to a lower temperature (e.g., a second temperature herein). In an embodiment, the second temperature may be any temperature at which the die bond material is in a partially solid form (e.g., at least partially solidified). In an embodiment, the second temperature may be a temperature in a range of 80° C. to 150° C. In an embodiment, the temperature is 80° C. or 150° C., At block 250, the mask is removed. In an embodiment, the mask is removed from the wafer through the die bond material, as the die bond material is partially solidified. Turning back to FIG. 3, the mask 320 can be removed through the continuous layer 350. Upon removal, based on a level of solidification of the continuous layer 350, a grid pattern may remain as shown in image 360 if the continuous layer 350 is more solid. Alternatively, the continuous layer 350 may reform to provide a single surface if the continuous layer 350 is more liquid. Each embodiment is based on an amount of cooling at block 240 (e.g., how low the second temperature is). After removal, in an embodiment, the continuous layer 350 may have a thickness in the range of 2 μM to 5 μM. In an embodiment, the continuous layer 350 may have a thickness of 3 μM or less.

At block 260, the die bond material is cured. In this way, the continuous layer 350 is solidified to form a thin DAF layer.

Figure 4:
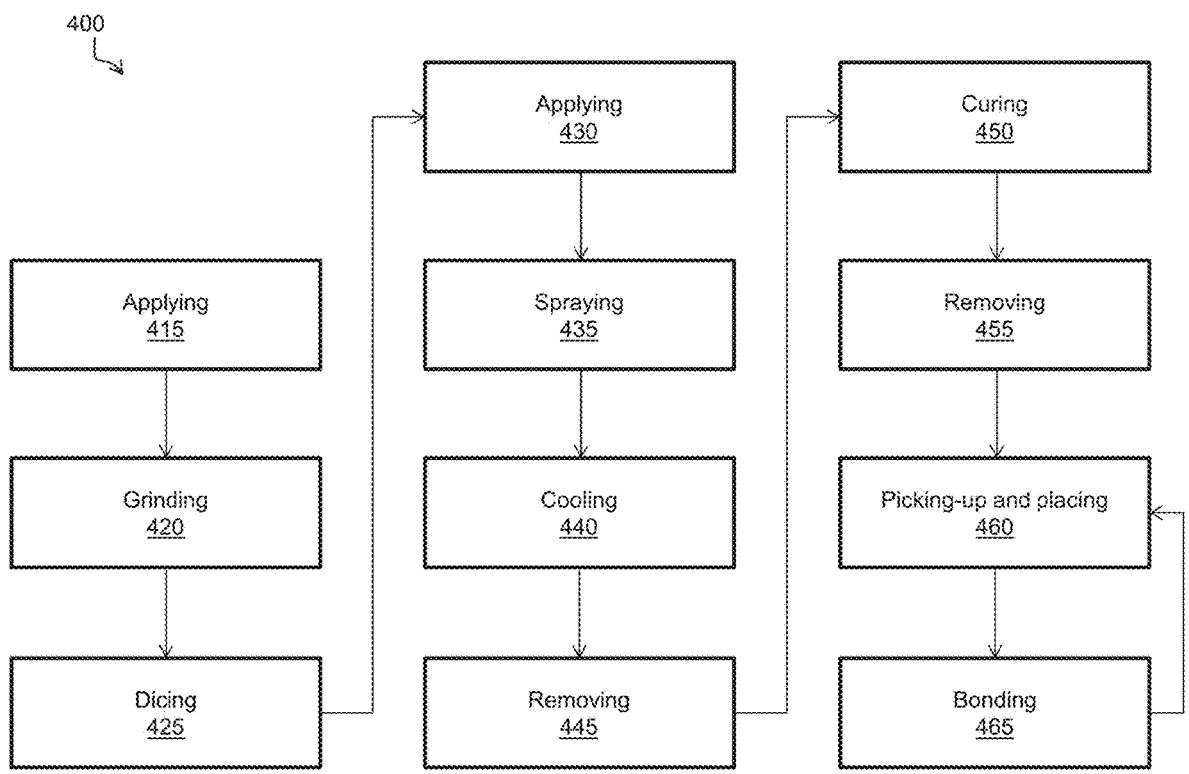
FIG. 4 is a flow diagram depicting a method for forming a semiconductor die stack including a DAF layer according to one or more embodiments.

FIG. 4 is a flow diagram depicting a method 400 for forming a semiconductor die stack including a DAF layer according to one or more embodiments.

At block 415, a back grinding (BG) tape is applied to a surface of a wafer (e.g., a silicon wafer). In an embodiment, the BG tape can be applied to decrease chipping levels that may result following dicing. At block 420, the wafer is grinded (e.g., to thin the wafer).

At block 425, the wafer is diced using known techniques. In an embodiment, a ring or a frame can be used to stabilize the wafer during the dicing. In another embodiment, a ring or frame is not used to stabilize the wafer. The dicing may also be done using a saw having a saw width to allow for tolerance control.

At block 430, a mask is applied to the wafer. At block 435, a die bond material is sprayed on to the wafer while the mask is applied. In an embodiment, the die bond material is sprayed at a first temperature. At block 440, the die bond material is cooled. In an embodiment, a temperature of the die bond material present on the silicon wafer (e.g., the first temperature at the time of spraying) is cooled to a lower temperature (e.g., a second temperature herein), so that the die bond material is in a partially solid form (e.g., at least partially solidified), At block 445, the mask is removed. In an embodiment, the mask is removed from the wafer through the die bond material, as the die bond material is partially solidified. After removal, in an embodiment, the die bond material may have a thickness in the range of 2 μM to 5 μM. In an embodiment, the die bond material may have a thickness of 3 μM or less. At block 450, the die bond material is cured. In this way, the die bond material is solidified to form a thin DAF layer. At block 455, the BG tape is removed from the wafer surface.

At blocks 460 and 465, individual segments (e.g., a die including the thin DAF layer, such as a pair 150 of FIG. 1) of the wafer are picked-up, placed/stacked on an intermediate carrier (e.g., a waffle pack, gel pack, tape and reel, a substrate), and bonded in place. In an embodiment, a first segment may be picked up and placed directly on the substrate, while a number of additional segments are stacked vertically on the first segment. Picking-up and placing/stacking may be performed using automation and machines. Further, bonding of the individual segments of the wafer may be with a substrate or another die occurs.

The method 400 can thus manufacture a semiconductor die stack (as described with respect to FIG. 1). In an embodiment, the dies comprising the thin DAF layer may be assembled into a semiconductor die stack having dies that are vertically stacked and staggered such that an offset between edges of two overlapping die is a minimum distance from the edge of one of the die to the edge of another, providing a minimum clearance between a bonding pad and the edge of the next higher die in the semiconductor die stack.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. Similarly, the words "include," "including," and "includes" mean including, but not limited to. Also, as used herein, the word "may" is used in a permissive sense (i.e., meaning having the potential to), rather than the mandatory sense (i.e., meaning must).

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to."

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

The descriptions of the various embodiments herein have been presented for purposes of illustration, but are not intended to be exhaustive or limited to the embodiments disclosed. That is, while the disclosure is susceptible to various modifications and alternative forms, specific embodiments thereof are shown by way of example in the drawings and will herein be described in detail. Many modifications and variations will be apparent to those of ordinary skill in the art without departing from the scope and spirit of the described embodiments. Thus, it should be understood, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   dicing a wafer;
   applying a mask;
   spraying die bond material, in a liquid form at a first temperature, to a surface of the wafer, wherein the die bond material comprises at least one additive that increases a viscosity of the die bond material while in the liquid form to enable the spraying to achieve a targeted thickness for the die bond material;
   cooling the die bond material at a second temperature to at least partially solidify the die bond material;
   removing the mask from the wafer through the die bond material, wherein the die bond material reforms to provide a single surface based on a level of solidification of the die bond material after the removing of the mask; and
   after the removing of the mask, curing the die bond material to form a die attach film layer on the wafer.

2. The method of claim 1, wherein the die attach film layer comprises a thickness along a range of 2 µM to 5 µM.

3. The method of claim 2, wherein the die attach film layer comprises a thickness of 3 µM.

4. The method of claim 1, wherein the first temperature is approximately 220° C., and wherein the second temperature is approximately 80° C.

5. The method of claim 1, wherein the die bond material comprises 1,2 dichloro, 2-fluroethane.

6. The method of claim 1, wherein a die to die shear force is greater than 0.5 MPa.

7. The method of claim 1, further comprising:
   applying a back grinding tape to a second surface of the wafer prior to dicing.

8. The method of claim 7, further comprising:
   grinding the surface of the wafer prior to dicing.

9. The method of claim 7, further comprising:
   removing the back grinding tape from the second surface of the wafer following the curing.

10. The method of claim 1, wherein the mask is comprised of a metal resistant to deformation at the first temperature.

11. The method of claim 1, wherein the mask is removed from the wafer through the die bond material as the die bond material is at least partially solidified.

* * * * *